(12) United States Patent
Yu et al.

(10) Patent No.: US 8,450,200 B2
(45) Date of Patent: May 28, 2013

(54) METHOD FOR STACKED CONTACT WITH LOW ASPECT RATIO

(75) Inventors: Chen-Hua Yu, Hsin-Chu (TW); Chen-Nan Yeh, Hsi-Chih (TW); Chih-Hsiang Yao, Taipei (TW); Wen-Kai Wan, Hsin-Chu (TW); Jye-Yen Cheng, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 12/973,707

(22) Filed: Dec. 20, 2010

(65) Prior Publication Data
US 2011/0092019 A1    Apr. 21, 2011

Related U.S. Application Data

(63) Continuation of application No. 11/706,553, filed on Feb. 13, 2007, now Pat. No. 7,880,303.

(51) Int. Cl.
*H01L 21/44*    (2006.01)

(52) U.S. Cl.
USPC ........... 438/597; 438/618; 438/672; 257/382; 257/753; 257/758

(58) Field of Classification Search
USPC .................. 438/597, 618, 672; 257/382, 753, 257/758
See application file for complete search history.

(56) References Cited

U.S. PATENT DOCUMENTS

| | | | |
|---|---|---|---|
| 5,612,254 A | 3/1997 | Mu et al. | |
| 5,817,572 A | 10/1998 | Chiang et al. | |
| 5,969,422 A | 10/1999 | Ting et al. | |
| 6,016,000 A | 1/2000 | Moslehi | |
| 6,016,003 A | 1/2000 | Uemura | |
| 6,114,243 A | 9/2000 | Gupta et al. | |
| 6,352,917 B1 | 3/2002 | Gupta et al. | |
| 6,764,810 B2 | 7/2004 | Ma et al. | |

(Continued)

FOREIGN PATENT DOCUMENTS

CN    182 5567 A    8/2006

OTHER PUBLICATIONS

Donaton, R.A., et al., "Integration of Cu and low-k dielectrics: effect of hard mask and dry etch on electrical performance of damascene structures," Microelectronic Engineering 55 (2001), pp. 277-283, Elsevier Science B.V.

(Continued)

*Primary Examiner* — A. Sefer
*Assistant Examiner* — Farid Khan
(74) *Attorney, Agent, or Firm* — Slater & Matsil, L.L.P.

(57) ABSTRACT

A method for an integrated circuit structure includes providing a semiconductor substrate; forming a metallization layer over the semiconductor substrate; forming a first dielectric layer between the semiconductor substrate and the metallization layer; forming a second dielectric layer between the semiconductor substrate and the metallization layer, wherein the second dielectric layer is over the first dielectric layer; and forming a contact plug with an upper portion substantially in the second dielectric layer and a lower portion substantially in the first dielectric layer. The contact plug is electrically connected to a metal line in the metallization layer. The contact plug is discontinuous at an interface between the upper portion and the lower portion.

20 Claims, 8 Drawing Sheets

U.S. PATENT DOCUMENTS

| | | |
|---|---|---|
| 6,776,622 B2 | 8/2004 | Yang et al. |
| 6,781,193 B2 | 8/2004 | Lee et al. |
| 6,946,391 B2 | 9/2005 | Tsai et al. |
| 6,962,771 B1 | 11/2005 | Liu et al. |
| 7,074,721 B2 | 7/2006 | Wang |
| 7,084,030 B2 | 8/2006 | Lee et al. |
| 7,189,613 B2 | 3/2007 | Tu |
| 7,399,706 B2 | 7/2008 | Omoto et al. |
| 2007/0099414 A1* | 5/2007 | Frohberg et al. .............. 438/618 |

OTHER PUBLICATIONS

Jeng, C.C., et al., "BEOL Process Integration of 65 nm Cu/Low k Interconects," Proceedings of the IEEE 2004 International Interconnect Technology Conference, Jun. 7-9, 2004, pp. 199-201.

Hussein, M.A., etal., "Materials' Impact on Interconnect Process Technology and Reliability," IEEE Transactions on Semiconductor Manufacturing, vol. 18, No. 1, Feb. 2005, pp. 69-85, IEEE.

* cited by examiner

METHOD FOR STACKED CONTACT WITH LOW ASPECT RATIO

This application is a continuation of U.S. patent application Ser. No. 11/706,553, filed Feb. 13, 2007, and entitled "Stacked Contact with Low Aspect Ratio", which application is hereby incorporated herein by reference in its entirety.

TECHNICAL FIELD

This invention relates generally to integrated circuits, and more particularly to the formation of contact plugs connecting semiconductor devices and metallization layers.

BACKGROUND

In modern integrated circuits, semiconductor devices are formed on semiconductor substrates, and are connected through metallization layers. The metallization layers are interconnected to the semiconductor devices through contact plugs. Also, external pads are connected to the semiconductor devices through the contact plugs.

FIG. 1 illustrates conventional plugs for connecting the semiconductor devices to the metallization layers. Transistor 4, which symbolizes the semiconductor devices, is formed on semiconductor substrate 2. Inter-layer dielectric (ILD) 10 is formed on the semiconductor devices. Contact plugs 6 are formed in ILD 10 to connect source and drain regions 14 and gate 16 of transistor 4 to metal lines 7 in metallization layer 8. Typically, the formation of contact plugs 6 includes forming openings in ILD 10, and then filling the openings with tungsten plugs. A single damascene is then performed to form metallization layer 8.

With the increasing down-scaling of integrated circuits, the conventional contact plugs 6 experience shortcomings. While the horizontal dimensions, such as the width W of contact plugs 6, are continuously shrinking, the thickness T of ILD 10 is not reduced accordingly to the same scale as width W of contact plugs 6. Accordingly, the aspect ratio of contact plugs 6 continuously increases. This lack of proper scaling incurs several problems. For example, the top width W of contact plugs 6 is typically greater than the bottom width W'. Therefore, top corners of contact plugs 6 may be shortened, partially due to optical proximity effects and the inaccurate control of the etching processes. High aspect ratio also results in difficulties in the control of the bottom profile of contact openings, which in turn results in unexpected circuit degradation, and even device failure.

Accordingly, what is needed in the art is a new contact structure and formation methods for solving the above-discussed problems.

SUMMARY OF THE INVENTION

In accordance with one aspect of the present invention, an integrated circuit structure includes a semiconductor substrate; a metallization layer over the semiconductor substrate; a first dielectric layer between the semiconductor substrate and the metallization layer; a second dielectric layer between the semiconductor substrate and the metallization layer, wherein the second dielectric layer is over the first dielectric layer; and a contact plug with an upper portion substantially in the second dielectric layer and a lower portion substantially in the first dielectric layer. The contact plug is electrically connected to a metal line in the metallization layer. The contact plug is discontinuous at an interface between the upper portion and the lower portion.

In accordance with another aspect of the present invention, an integrated circuit structure includes a semiconductor substrate; a metallization layer over the semiconductor substrate; a first dielectric layer between the semiconductor substrate and the metallization layer; a second dielectric layer between the semiconductor substrate and the metallization layer, wherein the second dielectric layer is over the first dielectric layer; and a contact plug. The contact plug includes a lower portion substantially in the first dielectric layer; an upper portion substantially in the second dielectric layer, wherein the upper portion is electrically connected to a metal line in the metallization layer; and a diffusion barrier layer between and adjoining the lower portion and the upper portion of the contact plug.

In accordance with yet another aspect of the present invention, an integrated circuit structure includes a semiconductor substrate; a semiconductor device at a surface of the semiconductor substrate; an etch stop layer over the semiconductor device; a first dielectric layer over the etch stop layer; a first contact plug substantially in the first dielectric layer and in contact with the semiconductor device; and a dual damascene structure. The dual damascene structure includes a second contact plug physically connected to the first contact plug, wherein the second contact plug is in a second dielectric layer; a third dielectric layer over the second dielectric layer; and a metal line in the third dielectric layer, wherein the metal line and the second contact plug are continuously interconnected.

In accordance with yet another aspect of the present invention, a method for forming an integrated circuit structure includes providing a semiconductor substrate; forming a first dielectric layer over the semiconductor substrate; forming a lower portion of a contact plug substantially in the first dielectric layer; forming a second dielectric layer over the first dielectric layer; forming an upper portion of the contact plug substantially in the second dielectric layer, wherein the upper portion and the lower portion of the contact plug are physically connected; and forming a metallization layer over the second dielectric layer, wherein the metallization layer comprises a metal line electrically connected to the upper portion of the contact plug.

In accordance with yet another aspect of the present invention, a method for forming an integrated circuit structure includes providing a semiconductor substrate; forming a semiconductor device at a surface of the semiconductor substrate; forming an etch stop layer over the semiconductor device; forming a first dielectric layer over the etch stop layer; forming a first opening in the first dielectric layer, wherein a component of the semiconductor device is exposed through the first opening; filling the first opening with a conductive material to form a lower portion of a contact plug; forming a second dielectric layer over the first dielectric layer; forming a second opening in the second dielectric layer, wherein the lower portion of the contact plug is exposed through the second opening; filling the second opening with a conductive material to form an upper portion of a contact plug; forming a third dielectric layer over the second dielectric layer; forming a trench in the third dielectric layer; and filling the trench with a conductive material to form a metal line connecting to the upper portion of the contact plug.

The advantageous features of the present invention include reducing aspect ratio of contact plugs, and reducing top corner shortening of the contact plugs. The bottom profile of the contact plugs may also be improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel stacked contact plug structure is provided. The intermediate stages of manufacturing a preferred embodiment of the present invention are illustrated. The variations of the preferred embodiment are then discussed. Throughout the various views and illustrative embodiments of the present invention, like reference numbers are used to designate like elements.

Figure 1:
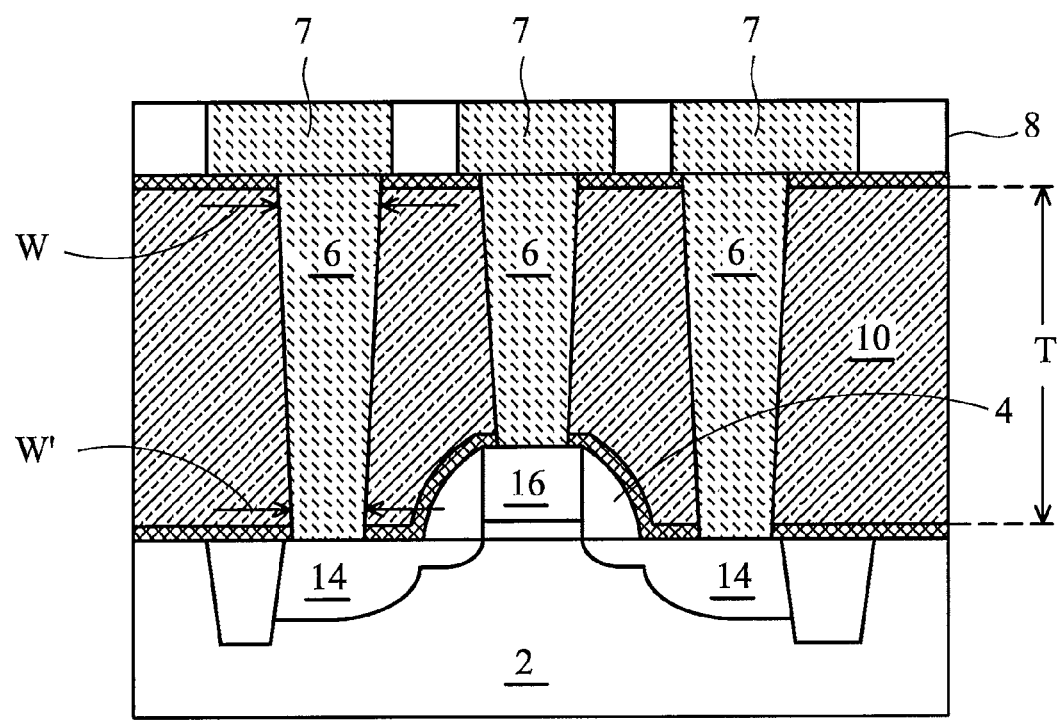
FIG. 1 illustrates conventional contact plugs for connecting a transistor to an overlying metallization layer.
Figure 2:
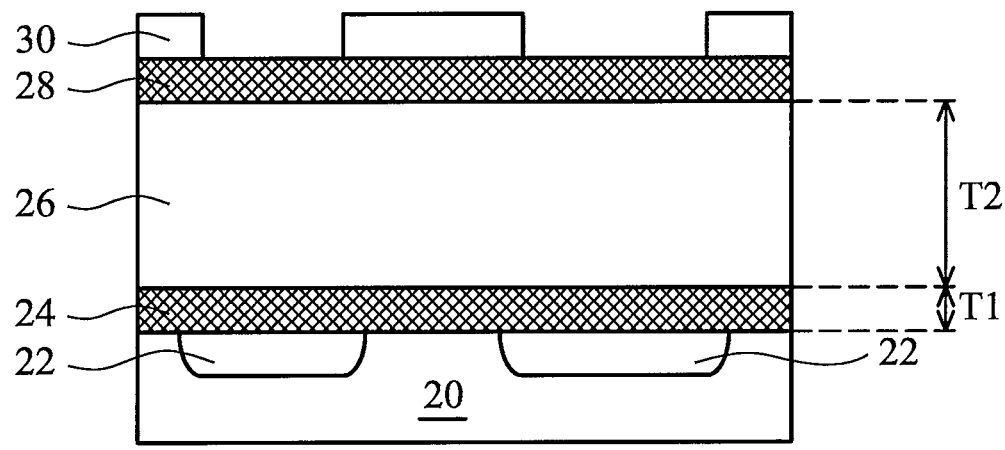
FIGS. 2 through 9 are cross-sectional views of intermediate stages in the manufacturing of a first embodiment of the present invention, wherein a dual damascene process is used to form upper portions of contact plugs and a bottom metallization layer.

FIGS. 2 through 9 illustrate cross-sectional views of a first embodiment of the present invention. Referring to FIG. 2, substrate 20 is provided. Substrate 20 is preferably a semiconductor substrate, which may include single crystalline semiconductor materials such as silicon, or compound materials having commonly used group III, group IV and group V elements. Regions 22 are illustrated to symbolize semiconductor device components, which will be in contact with the subsequently formed contact plugs. Regions 22 may be source and drain regions (or the corresponding silicide regions) of transistors, contact pads of resistors, and silicide regions. Also, regions 22 symbolize contact regions formed over substrate 20, such as gate electrodes, plates of capacitors, and corresponding silicide regions.

Etch stop layer (ESL) 24 is formed over substrate 20 and regions 22. In an embodiment, ESL 24 includes silicon nitride. In other embodiments, ESL 24 includes other commonly used dielectric materials, such as silicon oxynitride, silicon oxycarbide, silicon carbide, and the like. A thickness T1 of ESL 24 is preferably less than about 600 Å, and more preferably between about 200 Å and about 600 Å.

Inter-layer dielectric (ILD) 26 is formed over ESL 24. In an embodiment, ILD 26 has a thickness T2 of less than about 300 nm, and more preferably less than about 200 nm. The dielectric constant (k value) of ILD 26 is preferably less than about 4. Exemplary materials of ILD 26 include phosphosilicate glass (PSG), undoped silicon oxide, and other commonly used ILD materials.

For the patterning of ILD 26 and ESL 24, photoresist 30, and optionally antireflective coating (ARC) are formed. In an exemplary embodiment, photoresist 30 is formed on dielectric anti-reflective-coating (DARC) 28. Photoresist 30 is then patterned. In alternative embodiment, top-anti-reflective-coating (TARC, not shown) may be formed on photoresist 30.

Figure 3:
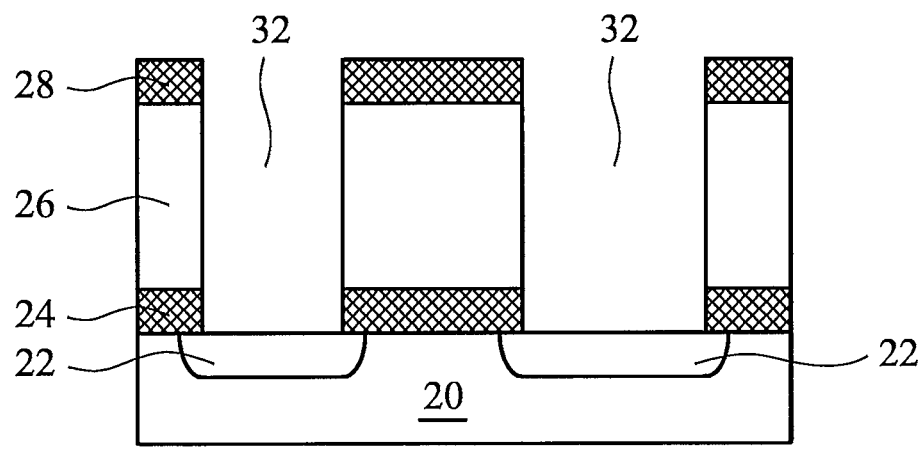
Figure 4:
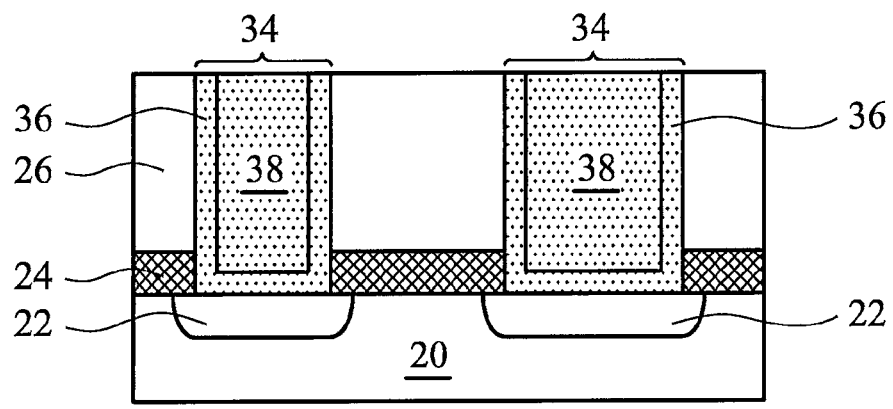
Figure 5:
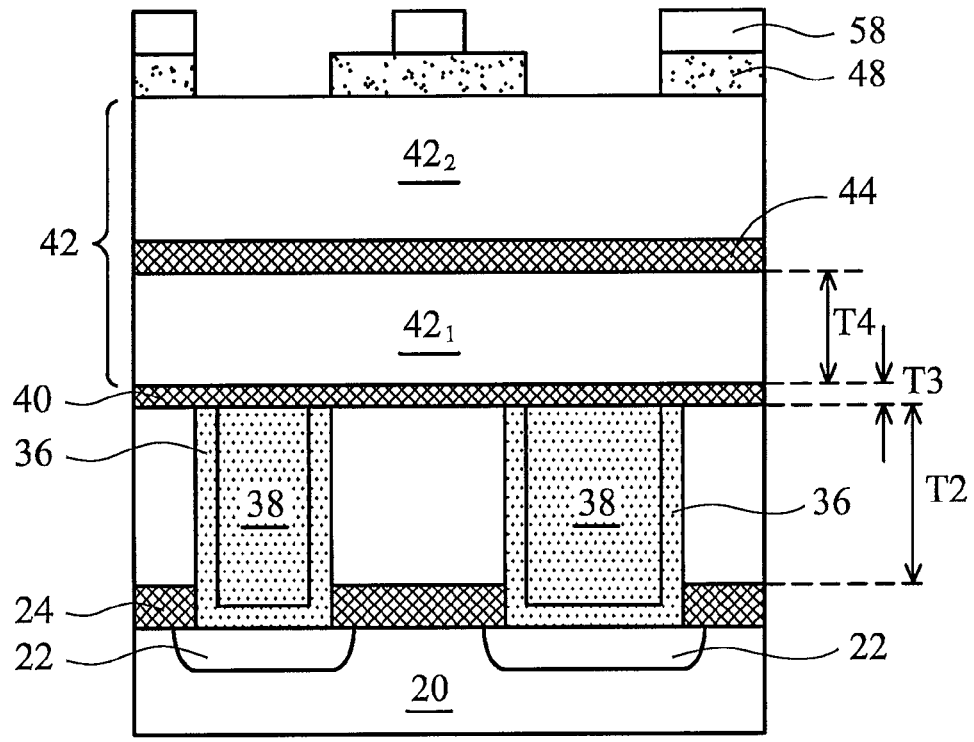

FIGS. 3 and 4 illustrate the forming and filling of contact openings 32. Preferably, as shown in FIG. 3, an anisotropic etching removes portions of DARC 28 and ILD 26, forming contact openings 32. Exposed portions of ESL 24 are then removed through contact openings 32, exposing underlying regions 22. In FIG. 4, lower contact plugs 34 are formed. Preferably, lower contact plugs 34 include contact liners 36 and fillers 38, which may be formed by depositing contact liners 36 on the bottom and sidewalls of contact openings 32, followed by the filling of fillers 38. Contact liners 36 preferably include TiN with a preferred thickness of less than about 50 Å. Fillers 38 preferably include tungsten, although other conductive materials such as aluminum, AlCu, copper, and the like may also be included.

FIGS. 5 through 9 illustrate a dual damascene process. ESL 40 is first formed on ILD 26 and contact plugs 34. ESL 40 may include silicon oxynitride, silicon oxycarbide, silicon carbide, and the like. Thickness T3 of ESL 40 is preferably less than about 600 Å, and more preferably between about 200 Å and about 600 Å.

A dielectric layer 42, which may include dielectric portion $42_1$ and dielectric portion $42_2$, is formed over ESL 40. In a first embodiment, dielectric portions $42_1$ and $42_2$ comprise the same materials, and are formed as a continuous layer. In other embodiments, dielectric portions $42_1$ and $42_2$ comprise the same or different materials, with an optional ESL 44 formed therebetween. Dielectric portion $42_1$ preferably has a low k value, for example, less than about 3.5, although dielectric materials with higher k values may be used. Exemplary materials include PSG, undoped silicon oxide, fluorinated silicon glass (FSG), carbon-doped silicon oxide, organic low-k dielectric, and the combinations thereof. Further, the k value of dielectric portion $42_1$ is preferably lower than the k value of ILD 26. Thickness T4 of dielectric portion $42_1$ is preferably between about ½ and about ⅔ of the total thickness of T2, T3 and T4, wherein the total thickness preferably equals to the desired ILD thickness for the existing formation technology. Exemplary thickness T4 of dielectric portion $42_1$ is preferably between about 1000 Å and about 2500 Å. The preferred formation methods of dielectric layer 42 include spin-on, chemical vapor deposition (CVD) or other known methods. Next, DARC 48 and photoresist 50 are formed.

Figure 6:
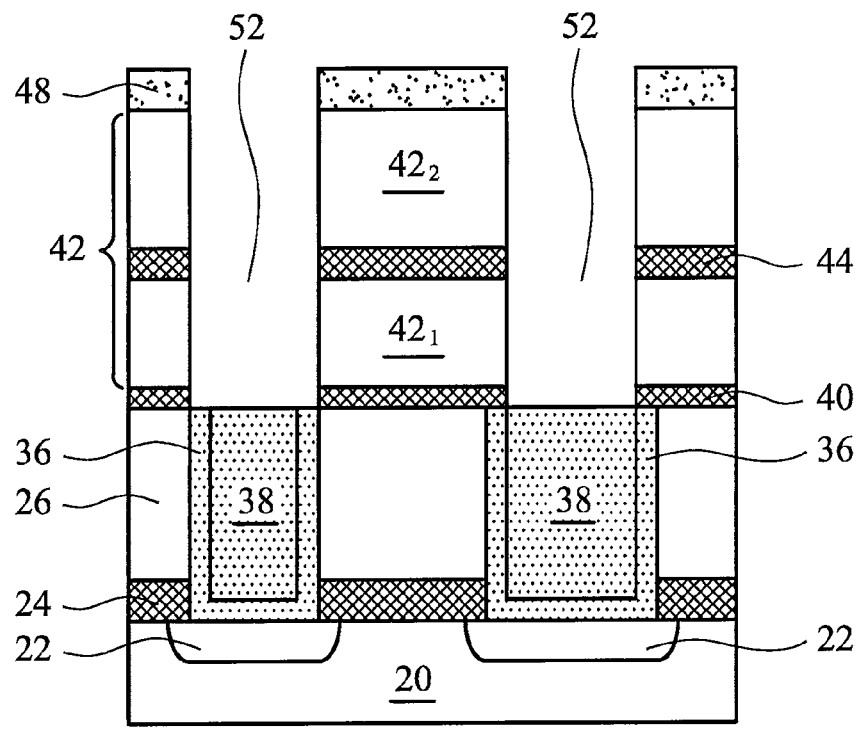

FIG. 6 illustrates the formation of via openings 52. First, an anisotropic etching cuts through dielectric layer 42 and stops at ESL 40, forming via openings 52. Next, photoresist 50 is removed.

Figure 7:
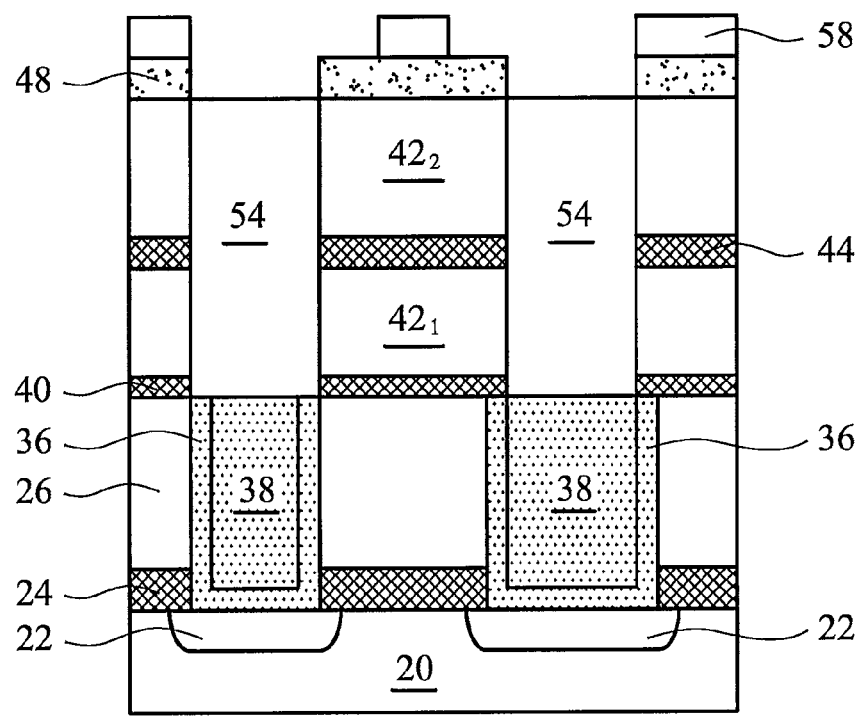
Figure 8:
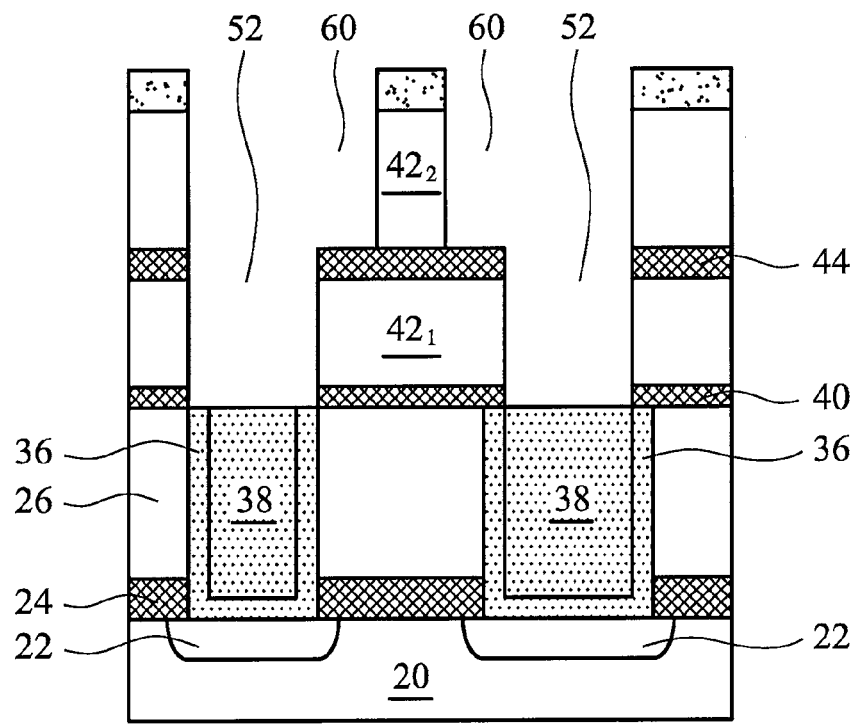

Referring to FIG. 7, polymer 54 is filled into via openings 52. Photoresist 58 is formed and patterned, which defines patterns for metal lines in the bottom metallization layer. FIG. 8 illustrates the formation of trench openings 60, for example, by etching, wherein trench openings 60 preferably have a width of less than about 65 nm. In the embodiment ESL 44 is formed between dielectric portions $42_1$ and $42_2$, ESL 44 is used to stop the formation of trench openings 60. Otherwise, time-mode is used to control the depth of trench openings 60 to a desired value.

The embodiment discussed in the preceding paragraphs uses a via-first approach, in which via openings 52 are formed before trenches 60. In alternative embodiments, trench-first approach may be taken, in which trench openings 60 are formed before the formation of via openings 52. One skilled in the art will realize the corresponding process steps.

Figure 9:
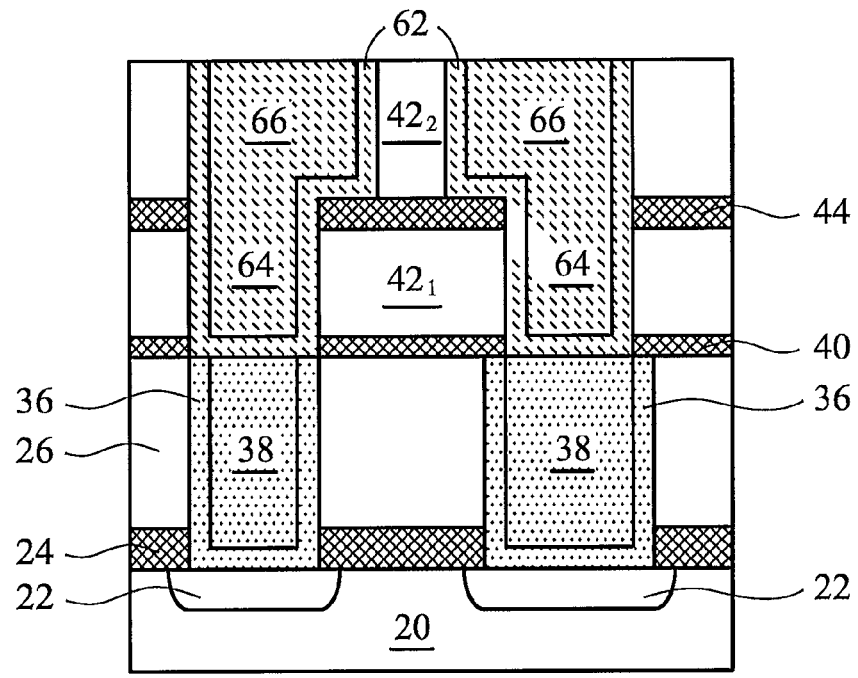

Referring to FIG. 9, diffusion barrier layers 62 are formed in via openings 52 and trench openings 60. Diffusion barrier layers 62 preferably comprise Ti, Ta, TiN, TaN, and the like. The remaining via openings 52 and trench openings 60 are then filled with conductive materials, preferably copper or copper alloys. A chemical mechanical polish is then performed to remove excess materials. The remaining portion of the conductive material forms upper contact plugs 64 and metal lines 66. In the preferred embodiment, the resistivity of upper contact plugs 64 and metal lines 66 is lower than that of lower contact plugs 34. In the resulting structure as shown in FIG. 9, metal lines 66 and dielectric portion $42_2$ form the bottom metallization layer, typically referred to as M1. Upper contact plugs 64 and lower contact plugs 34 in combination form upper portions and lower portions of contact plugs, respectively.

Figure 10:
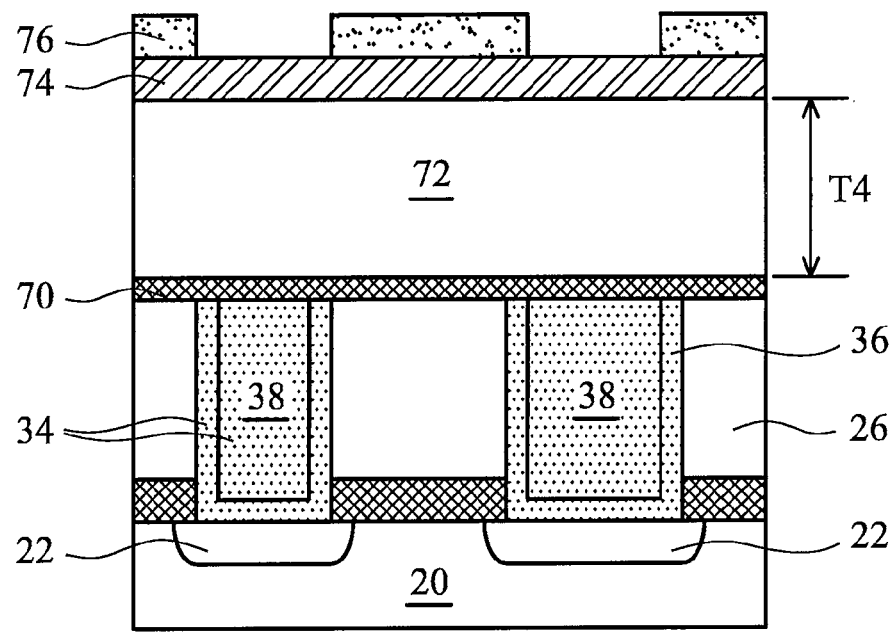
FIGS. 10 through 13 are cross-sectional views of intermediate stages in the manufacturing of a second embodiment of the present invention, wherein single damascene processes are used to form upper portions of contact plugs and a bottom metallization layer.

FIGS. 10 through 13 illustrate a second embodiment of the present invention, wherein single damascene processes are used to form upper contact plugs and the bottom metallization layer M1. The initial process steps are essentially the same as shown in FIGS. 2 through 4. Next, as shown in FIG. 10, ESL 70, ILD 72, DARC 74 and photoresist 76 are sequentially formed, wherein the thickness of ESL 70 and ILD 72 are preferably the same as thicknesses T3 and T4 as in FIG. 5, respectively. ILD 72 may include essentially the same materials as dielectric portion $42_1$ (refer to FIG. 9). Photoresist 76 is then patterned.

Figure 11:
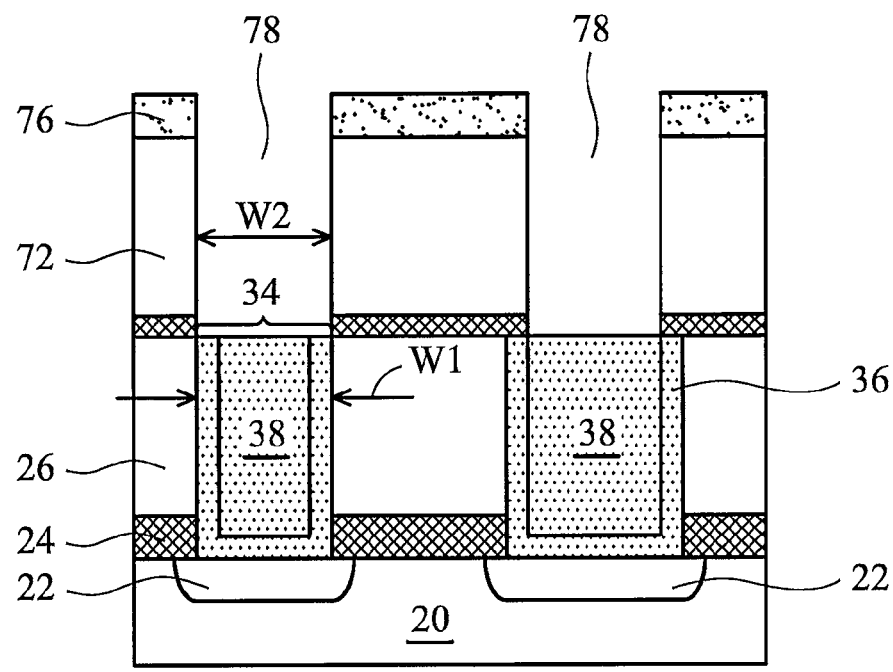
Figure 12:
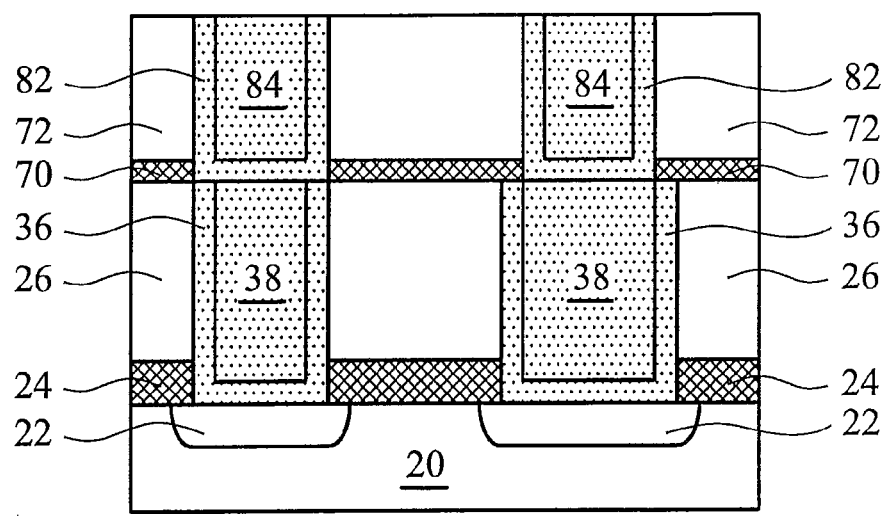

Next, as shown in FIG. 11, contact openings 78 are formed, exposing lower contact plugs 34. Width W2 of contact openings 78 may be greater than, equal to, or smaller than width W1 of lower contact plugs 34, and both are preferably less than about 50 nm. Referring to FIG. 12, contact openings 78 are filled with conductive materials to form upper contact plugs, which include contact liners 82 and fillers 84. Contact liners 82 may include either the same materials as contact liners 36, or the same materials as diffusion barrier layers 62 (refer to FIG. 9), while fillers 84 may include the same materials as fillers 38, or the same materials as metal lines 66 (refer to FIG. 9).

Figure 13:
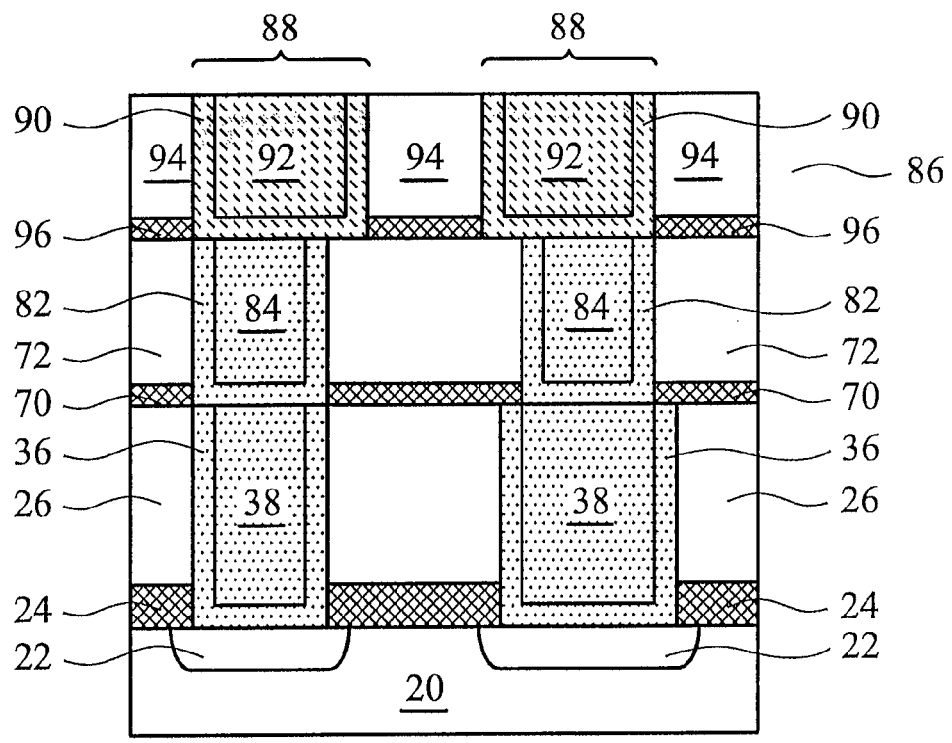

Next, as shown in FIG. 13, metallization layer 86 is formed using a single damascene process, wherein metal lines 88 are formed in the trenches of dielectric layer 94. Preferably, metal lines 88 each include a diffusion barrier layer 90 and a copper line 92. ESL 96 may be formed between dielectric layer 94 and ILD 72.

Figure 14:
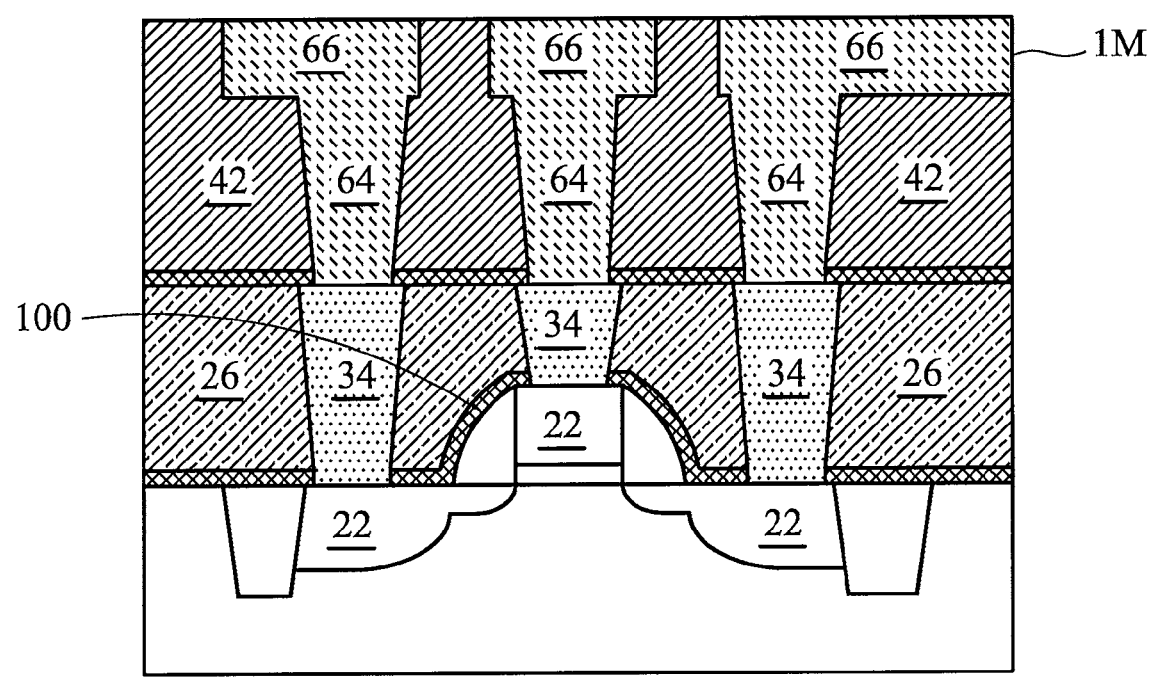
FIG. 14 illustrates a profile of the embodiments of the present invention.

FIG. 14 illustrates an application of the embodiments of the present invention, which illustrates stacked contact plugs connected to source and drain regions of transistor 100. Like reference numerals in FIG. 9 are used to indicate like components in FIG. 14. The lower portions 34 of contact plugs electrically contact regions 22, which include source and drain regions and a gate electrode. The upper portions 64 of the stacked contact plugs are stacked on lower portions 34. Metal lines 66 are formed in metallization layer M1 and are connected to contact plugs 64.

It is noted that regardless whether the top portions of contact plugs are formed using single damascene processes or dual damascene processes, the top portions and bottom portions of the contact plugs are discontinuous at their interfaces. First, the discontinuity is resulted from diffusion barrier layers 62 (refer to FIG. 9) or contact liners 82 (refer to FIG. 13). Second, the materials of the upper portions and lower portions of the contact plugs may be different. In addition, even if the mask for forming the upper portions and lower portions have the same size, since contact plugs and vias are typically tapered, at the interfaces of the upper portions and lower portions of the contact plugs, the cross-sectional dimensions of the upper portions and lower portions of the contact plugs may be different, an exemplary embodiment is also shown in FIG. 14.

The embodiments of the present invention have several advantageous features. Since the contact plugs in the present invention are separated as lower portions and upper portions, the aspect ratios of the lower portions and upper portions are significantly lower than that of contact plugs formed in a single step. For example, with a contact plug having a height of about 3500 Å and a width of about 400 Å, the aspect ratio is about 8.75. With a thickness of about one half of 3500 Å, the aspect ratio is reduced to about 4.4. Accordingly, the problems related with the high aspect ratio, such as top corner shorting, uncontrollable bottom profiles, are at least reduced, and possible eliminated.

An additional advantageous feature of the present invention is the reduction in parasitic capacitance. Since the contact plugs are separated as upper portions and lower portions, the parasitic capacitance between each of the contact plugs and corresponding neighboring plugs are divided into a top capacitance and a bottom capacitance connected in parallel. Since dielectric materials with lower k values than conventional ILDs may be used for the formation of upper portions of the contact plugs, the top capacitance is reduced. Accordingly, the entire capacitance between a contact plug and the respective neighboring contact plugs is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
    providing a semiconductor substrate;
    forming a first dielectric layer having a first thickness over the semiconductor substrate;
    forming a lower portion of a contact plug substantially in the first dielectric layer;
    forming an etch stop layer having a second thickness over the first dielectric layer;
    forming a second dielectric layer over the first dielectric layer and over the etch stop layer, the second dielectric layer having a third thickness, the third thickness is between about one half and about two-thirds the sum of the first thickness, the second thickness and the third thickness;
    forming an upper portion of the contact plug substantially in the second dielectric layer, wherein the upper portion comprises a via filled with a first conductor material and the lower portion of the contact plug comprises a contact formed of a material different from the first conductor material, and the upper portion and the lower portion are physically connected and the contact plug is discontinuous at an interface between the upper portion and the lower portion; and forming a metallization layer over the second dielectric layer, wherein the metallization layer comprises a metal line electrically connected to the upper portion of the contact plug.

2. The method of claim 1 further comprising forming a semiconductor device at a surface of the semiconductor substrate, wherein the contact plug physically contacts the semiconductor device and the metal line.

3. The method of claim 1, wherein the steps of forming the upper portion of the contact plug and forming the metallization layer each comprise a single damascene process.

4. The method of claim 1, wherein the steps of forming the upper portion of the contact plug and forming the metallization layer are performed in a dual damascene process.

5. The method of claim 4, wherein the second dielectric layer and a dielectric layer in the metallization layer form a continuous dielectric layer.

6. The method of claim 1 further comprising forming an etch stop layer between the metallization layer and the second dielectric layer.

7. The method of claim 1, wherein the second dielectric layer has a lower dielectric constant than the first dielectric layer.

8. The method of claim 1, wherein the upper portion of the contact plug has a lower resistivity than the lower portion of the contact plug.

9. The method of claim 1, wherein the upper portion of the contact plug has a height of between about one-half and about two-thirds of the contact plug.

10. The method of claim 1, wherein the step of forming the upper portion of the contact plug comprises:
   forming an opening in the second dielectric layer, wherein the lower portion of the contact plug is exposed through the opening;
   forming a diffusion barrier layer on a bottom and sidewalls of the opening;
   filling a remaining portion of the opening with a copper-containing material; and
   performing a chemical mechanical polish to remove excess copper-containing material on the second dielectric layer.

11. A method for forming an integrated circuit structure, the method comprising:
   providing a semiconductor substrate;
   forming a semiconductor device at a surface of the semiconductor substrate;
   forming an etch stop layer over the semiconductor device;
   forming a first dielectric layer over the etch stop layer, the first dielectric layer having a first thickness;
   forming a first opening in the first dielectric layer, wherein a component of the semiconductor device is exposed through the first opening;
   filling the first opening with a first conductive material to form a lower portion of a circular contact plug;
   forming a second etch stop layer over the first dielectric layer, the second etch stop layer having a second thickness;
   forming a second dielectric layer over the first dielectric layer, the second dielectric layer having a third thickness that is between about one half and about two thirds the sum of the first thickness, the second thickness and the third thickness;
   forming a second opening in the second dielectric layer, wherein the lower portion of the contact plug is exposed through the second opening;
   filling the second opening with a second conductive material to form an upper portion of the circular contact plug, the second conductive material being different from the first conductive material, the upper portion and the lower portion physically connected and the contact plug being discontinuous at an interface between the upper portion and the lower portion;
   forming a third dielectric layer over the second dielectric layer;
   forming a trench in the third dielectric layer; and
   filling the trench with a conductive material to form a metal line connecting to the upper portion of the contact plug.

12. The method of claim 11, wherein the steps of forming the second and the third dielectric layers are performed in a single step, and the steps of filling the trench and the second opening are performed in a single step.

13. The method of claim 11, wherein the second dielectric layer has a lower dielectric constant than the first dielectric layer.

14. The method of claim 11, wherein the upper portion of the contact plug has a lower resistivity than the lower portion of the contact plug.

15. The method of claim 11, wherein the upper portion of the contact plug has a height of between about one-half and about two-thirds of the contact plug.

16. The method of claim 11 further comprising forming an etch stop layer between and adjoining the first and the second dielectric layers.

17. The method of claim 11 further comprising forming an etch stop layer between and adjoining the second and the third dielectric layers.

18. The method of claim 11, wherein the step of filling the trench comprises forming a diffusion barrier layer in the trench and filling a copper-containing metallic material.

19. A method of for forming an integrated circuit structure, the method comprising:
   providing a semiconductor substrate;
   forming a semiconductor device at a surface of the semiconductor substrate;
   forming an etch stop layer over the semiconductor device;
   forming a first dielectric layer over the etch stop layer, the first dielectric layer having a first thickness;
   forming a first opening in the first dielectric layer, wherein a component of the semiconductor device is exposed through the first opening;
   filling the first opening with a first conductive material to form a lower portion of a circular contact plug;
   forming a second etch stop layer over the first dielectric layer, the second etch stop layer having a second thickness;
   forming a second dielectric layer over the first dielectric layer, the second dielectric layer having a third thickness that is between about one half and about two thirds the sum of the first thickness, the second thickness and the third thickness, wherein the second dielectric layer comprises a first lower dielectric layer, and a third etch stop layer;
   forming a second opening in the second dielectric layer, wherein the lower portion of the contact plug is exposed through the second opening, the second opening having a diameter;
   filling the second opening with a second conductive material to form an upper portion of the circular contact plug, the second conductive material being different from the first conductive material, the upper portion and the lower portion physically connected and the contact plug being discontinuous at an interface between the upper portion and the lower portion;

forming a third etch stop layer over the second dielectric layer;

forming a third dielectric layer over the second dielectric layer and the third etch stop layer;

forming a trench extending through the third dielectric layer and exposing the top surface of the upper portion of the contact plug, the trench having a width that is greater than the diameter of the second opening; and filling the trench with a conductive material to form a metal line connecting to the upper portion of the contact plug.

20. The method of claim 19, and further comprising forming a diffusion barrier between the upper portion and the lower portion of the contact plug.

\* \* \* \* \*